United States Patent
Erickson et al.

(10) Patent No.: US 9,424,948 B1
(45) Date of Patent: Aug. 23, 2016

(54) DETECTION OF INITIAL STATE BY EFUSE ARRAY

(71) Applicant: International Business Machines Corporation, Armonk, NY (US)

(72) Inventors: Karl R. Erickson, Rochester, MN (US); Phil C. Paone, Rochester, MN (US); David P. Paulsen, Inver Grove Heights, MN (US); John E. Sheets, II, Zumbrota, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/921,245

(22) Filed: Oct. 23, 2015

(51) Int. Cl.
  *G11C 17/16* (2006.01)
  *G11C 16/22* (2006.01)
  *G11C 16/34* (2006.01)

(52) U.S. Cl.
  CPC .............. *G11C 17/16* (2013.01); *G11C 16/225* (2013.01); *G11C 16/3436* (2013.01)

(58) Field of Classification Search
  CPC .. G11C 17/16; G11C 16/225; G11C 16/3436; G11C 29/787; G11C 16/04; G11C 29/027; G11C 29/812; G11C 2229/763; H01L 23/5252; H01L 27/105
  See application file for complete search history.

(56) References Cited

U.S. PATENT DOCUMENTS

| | | | |
|---|---|---|---|
| 5,598,550 A * | 1/1997 | Shen | G06F 12/0831 711/100 |
| 6,094,383 A | 7/2000 | Schoellkopf | |
| 6,282,121 B1 | 8/2001 | Cho et al. | |
| 6,515,904 B2 | 2/2003 | Moore et al. | |
| 6,515,923 B1 | 2/2003 | Cleeves | |
| 6,574,145 B2 | 6/2003 | Kleveland et al. | |
| 7,085,167 B2 | 8/2006 | Lee et al. | |
| 8,964,480 B2 | 2/2015 | Mui et al. | |
| 2014/0219000 A1 * | 8/2014 | Oh | G11C 17/16 365/96 |

* cited by examiner

*Primary Examiner* — J. H. Hur
*Assistant Examiner* — Ajay Ojha
(74) *Attorney, Agent, or Firm* — Brian Welle; Robert Williams

(57) ABSTRACT

An array of eFuses without a default state of logical one or logical zero includes rows and columns. One of the rows has data cells for programming as well as indicator data cells for indicating if the programmable data cells have been programmed. Each column includes a sense amplifier to sense the state of cells of the column. Sense amplifiers of columns with indicator data cells are coupled to one or more logic gates which determine if the indicator data cells are in a selected logical state. Sense amplifiers of columns with data cells are coupled to mask logic gates. The mask logic gates are coupled to both columns of data cells and outputs of the one or more logic gates. The logic gates mask outputs of the data cells when the indicator data cells are not in the selected logical state.

20 Claims, 4 Drawing Sheets

DETECTION OF INITIAL STATE BY EFUSE ARRAY

BACKGROUND

The present disclosure relates to computer memory, and more specifically, to eFuses with non-volatile memory.

Non-volatile memory is computer memory which can retain stored information even when not powered. Some types of non-volatile memory may contain field-effect transistors (FETs) which may be programmed. Charge trapping can be used to shift the voltage threshold of field-effect transistors.

SUMMARY

According to embodiments of the present disclosure, an apparatus, method, and design structure method for an array eFuse which can detect an initial state is disclosed. The apparatus and design structure includes an eFuse with a plurality of rows and a plurality of columns. A row of the plurality of rows may have a plurality of data cells for programming as well as a plurality of indicator data cells for indicating if the plurality of data cells has been programmed. A first plurality of columns of the eFuse array may include bitlines coupled to data cells, while a second plurality of columns of the eFuse array may include bitlines coupled to indicator data cells. Each column of the eFuse array may include a sense amplifier. Sense amplifiers of the second plurality of columns may be coupled to one or more logic gates which determine if indicator data cells of a wordline are in a selected logical state. Sense amplifiers of the first plurality of columns may be coupled to a plurality of mask logic gates, wherein each mask logic gate is coupled to a bitline of the first plurality of columns and to an output of the one or more logic gates. The plurality of logic gates may mask outputs of the plurality of data cells when the indicator data cells are not in the selected logical state.

The method of detecting if an array of eFuses is in an initial state may include determining that a plurality of indicator data cells of a wordline of the eFuse array is not in a selected logical state. The plurality of indicator data cells may indicate if the wordline has been programmed. A plurality of data cells for programming of the wordline may be in an initial state. The initial state may include random values. The initial state of the plurality of data cells may be masked with a default state. The default state may be passed to the primary output. The plurality of data cells may be programmed into a programmed state. The plurality of indicator data cells may be programmed into the selected logical state. The plurality of indicator data cells may be determined to be in the selected logical state. The programmed state of the primary output may be passed to the output of the eFuse array. The programmed state may be passed in response to determining that the plurality of indicator data cells are in the selected logical state.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
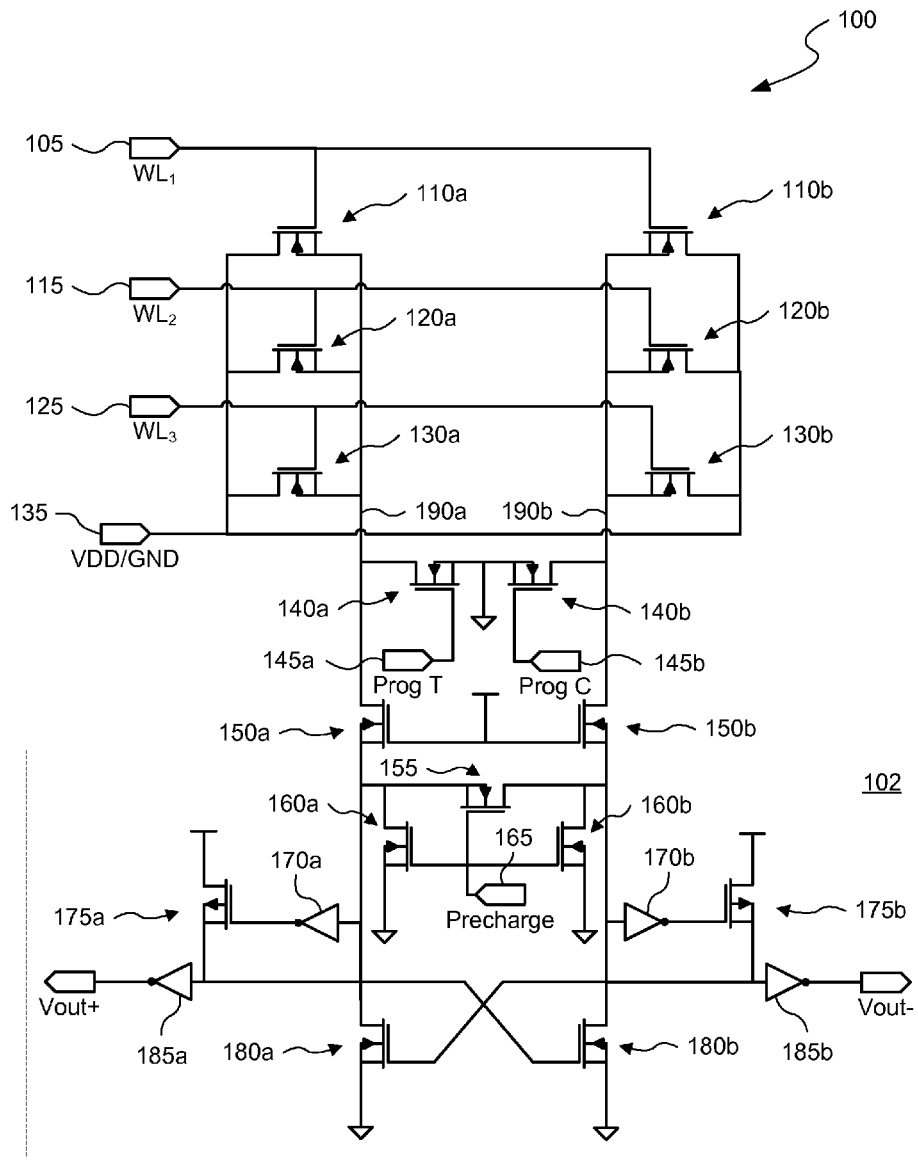
FIG. 1 depicts a diagram of a circuit using two FET memory cells along with a sensing circuit for sensing the programming of the memory cells, according to embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to eFuses. An eFuse may include a data cell comprised of two field effect transistors (FETs). A data cell comprised of two FETs may have an equal chance of being a one or a zero upon creation. Within a wordline of an eFuse array, most data cells may be for programming, while a subset of data cells (also referred to herein as a subset of indicator data cells) may be reserved to indicate whether the wordline has yet been programmed. Once a wordline is programmed, the subset of indicator data cells may be programmed to a predetermined state. The logic of the eFuse array may determine if the indicator data cells are in the predetermined state. If the indicator data cells are in the predetermined state, the logic of the eFuse array may allow the output of the majority of data cells to proceed to the primary output to the circuit. If the indicator data cells are not in the predetermined state the logic of the eFuse array may force the output of the majority of the data cells to a different state, such as all zeros. While the present disclosure is not necessarily limited to such applications, various aspects of the disclosure may be appreciated through a discussion of various examples using this context.

In instances, when building an eFuse array utilizing FET memory cells, cells of the eFuse array may not have a default state. Without a default state, a cell of such an eFuse array may have an equal likelihood of being built as a logical zero or a logical one. Without a known state it may be difficult or impossible for a system to determine if a wordline has been programmed or not. In further instances, a portion of eFuse array wordlines may be programmed while other wordlines are yet unprogrammed. In such instances, it may be difficult or impossible to determine which wordlines have and haven't been programmed. Given that the programmed status of such FET memory cell eFuse arrays may be difficult or impossible to determine, testing said eFuse arrays with standard testing flows may be itself difficult or impossible.

Aspects of the disclosure relate to providing two or more cells at the end of a wordline to signify if the wordline has been programmed. In certain embodiments, being as the initial state of bits are caused mostly by variation in the sense amp, the distribution of ones and zeros in the final bits of the wordline may be the most varied. Once a given wordline is programmed, the final bits of the given wordline may be changed to a predetermined state. The wordline may then be read. The final bits may be read out through a sequence of logic gates to determine if the final bits match the predetermined state. If the final bits match the predetermined state, the rest of the bits may be carried through unchanged to the primary output. If the final bits do not match the predetermined bits, all of the bits on the wordline may be forced to a specific state, such as all zeros, and then passed to the primary output. Indicating if wordlines of eFuse arrays utilizing FET memory cells have been programmed as such may have testing benefits as well as other benefits associated with knowing which wordlines have been programmed.

Embodiments of the present disclosure relate to eFuse arrays which utilize a sense circuit for sensing the state of a non-volatile memory cell. The memory cell may have two field-effect transistors (FETs). The memory cell may be programmed to create/hold a logical zero or a logical one based on which FET is programmed. Programming the FET may be completed with charge trapping to increase the voltage threshold (Vt) on the programmed FET.

Both FETs may share the same wordline signal. As the wordline signal increases, the FET with the lower Vt (e.g., the unprogrammed FET) will turn on first, pulling its corresponding bitline up first as well as pulling it up faster than the bitline connected to the programmed FET. The sense circuit includes large cross-coupled negative channel FETs (NFETs) connected to bitlines. The bitline which rises first turns on the NFET connected to the opposing bitline which pulls the opposing bitline towards ground, therein preventing the opposing bitline from turning on the second NFET. This may keep the bitline for the unprogrammed FET high and the bitline for the programmed FET low.

In some embodiments, bitlines are further connected to a positive channel FET (PFET) keeper device which finishes the bitline, therein activating the corresponding NFET to full supply voltage (Vdd). Further, bitlines may be connected to inverters which output a signal for the sense circuit based on the voltages of respective bitlines.

Referring to FIG. 1, a diagram of an example memory circuit 100 with a sensing circuit 102 for sensing the programming of memory cells of an eFuse is depicted. Circuit 100 includes three memory cells which each include two FETs. A first memory cell includes FETs 110a-b. A second memory cell includes FETs 120a-b. A third memory cell includes FETs 130a-b. Although three memory cells are depicted in FIG. 1 for purposes of explanation, any number of memory cells may be included in other implementations of an eFuse array. There is a wordline signal for each of the memory cells. Wordline 105 is shared by FETs 110a-b. Wordline 115 is shared by FETs 120a-b. Wordline 125 is shared by FETs 130a-b.

To program one of the FETs of a memory cell, a high voltage may be applied to the FET through the corresponding wordline and supply voltage 135. The bitline for the FET to be programmed may be grounded to provide a stream of electrons flowing through the FET. Electrons may be trapped in the gate dielectric of the NFET or holes trapped in the gate dielectric of the PFET, either of which may lead to a higher absolute Vt for the respective FET type. As depicted, program true 145a may be activated to turn on FET 140a and bring bitline 190a down to ground to program either FET 110a, FET 120a, or FET 130a. Similarly, program complement 145b may be activated to turn on FET 140b and bring bitline 190b down to ground to program either FET 110b, FET 120b, or FET 130b.

For example, to program FET 110a, wordline 105 and supply voltage 135 are set to a high voltage. Program true 145a is made high to activate FET 140a and pull bitline 190a toward ground. This causes high energy electrons (charge carriers) to flow through the channel of NFET (FET) 110a and become trapped in the gate dielectric of the device causing the absolute value of the Vt to increase.

FETs 150a-b may be configured to protect sense circuit 102 from the high voltage produced during the programming of memory cells.

To prepare for sensing the programming of a memory cell, bitlines 190a-b may be precharged to ground and balanced. Precharge 165 may be brought high to activate NFET 155, which balances bitlines 190a-b, and to activate NFETs 160a-b to bring bitlines 190a-b to ground. Supply voltage 135 is applied and the wordline applied to the applicable memory cell rises. A slow wordline slew may be used to help differentiate between the programmed and unprogrammed FETs in the memory cell. For example, a slow wordline slew may identify increases of 10% Vdd to 90% Vdd in about 200-800 ps (picoseconds). As the wordline voltage increases, it may activate the FETs of the memory cell, causing the voltage of the corresponding bitlines to increase. The unprogrammed FET may turn on first as it has a lower Vt. Thus, the bitline connected to the unprogrammed FET may rise faster than the bitline connected to the programmed FET.

NFETs 180a-b may be configured to pull the connected bitline to ground when turned on by the other bitline. NFET 180a is configured to pull bitline 190a toward ground in response to the increase in voltage of bitline 190b. Similarly, NFET 180b is configured to pull bitline 190b toward ground in response to the increase in voltage of bitline 190a. Thus, the bitline whose voltage rises faster may keep rising while preventing the other bitline from rising. NFETs 180a-b may be much larger than the FETs of the memory cells such that they overpower the FET quickly when pulling the corresponding bitline to ground.

Additionally, inverters 170a-b and PFETs 175a-b may be configured to pull the faster rising bitline to full Vdd rail. Inverters 170a-b may be configured to change output from high to low once the input bitline reaches a specified voltage. The low output may turn on the corresponding PFET 175a or 175b, which therein brings the bitline to full Vdd rail.

Inverters 185a-b may provide output from sense circuit 102. Inverter 185a may provide the main output for sense circuit 102. For example, a high output from inverter 185a may represent a logical one and a low output may represent a logical zero.

For example, assume FET 120a has been programmed. To read the memory cell containing FETs 120a-b, bitlines 190a-b are balanced and brought to ground with precharge 165. Precharge 165 is turned off and wordline 115 is slowly raised. FET 120b has a lower Vt than FET 120a. Thus, FET 120b will turn on first and cause bitline 190b to rise before bitline 190a. Bitline 190b will turn on NFET 180a which will pull bitline 190a toward ground. Inverter 170b will change its output to low in response to rising bitline 190b and activate PFET 175b to bring bitline 190b to Vdd rail. The main output from inverter 185a will be high (e.g., a logical one) in response to bitline 190a being low and the output of inverter 185b will be low in response to bitline 190b being high. Sense circuit 102 may stay in this state until a new precharge is grounded.

When initially building an eFuse array utilizing two FET memory cells such as in FIG. 1, memory cells may not have a default state. Put differently, memory cells of an eFuse array utilizing two FET technology may have an equal likelihood of being read as a logical zero or a logical one. For example, upon creation, the first memory cell which includes FETs 110a and 110b will have an initial value which may be read. However, the first memory cell may have an equal likelihood of being built with a higher Vt on 110a or a higher Vt on 110b.

Given that the memory cells derive a state/value from either one FET or another having a higher Vt, the equal probability of either FET of a two-FET memory cell having a high absolute Vt may result in the memory cell not having a default state.

Figure 2:
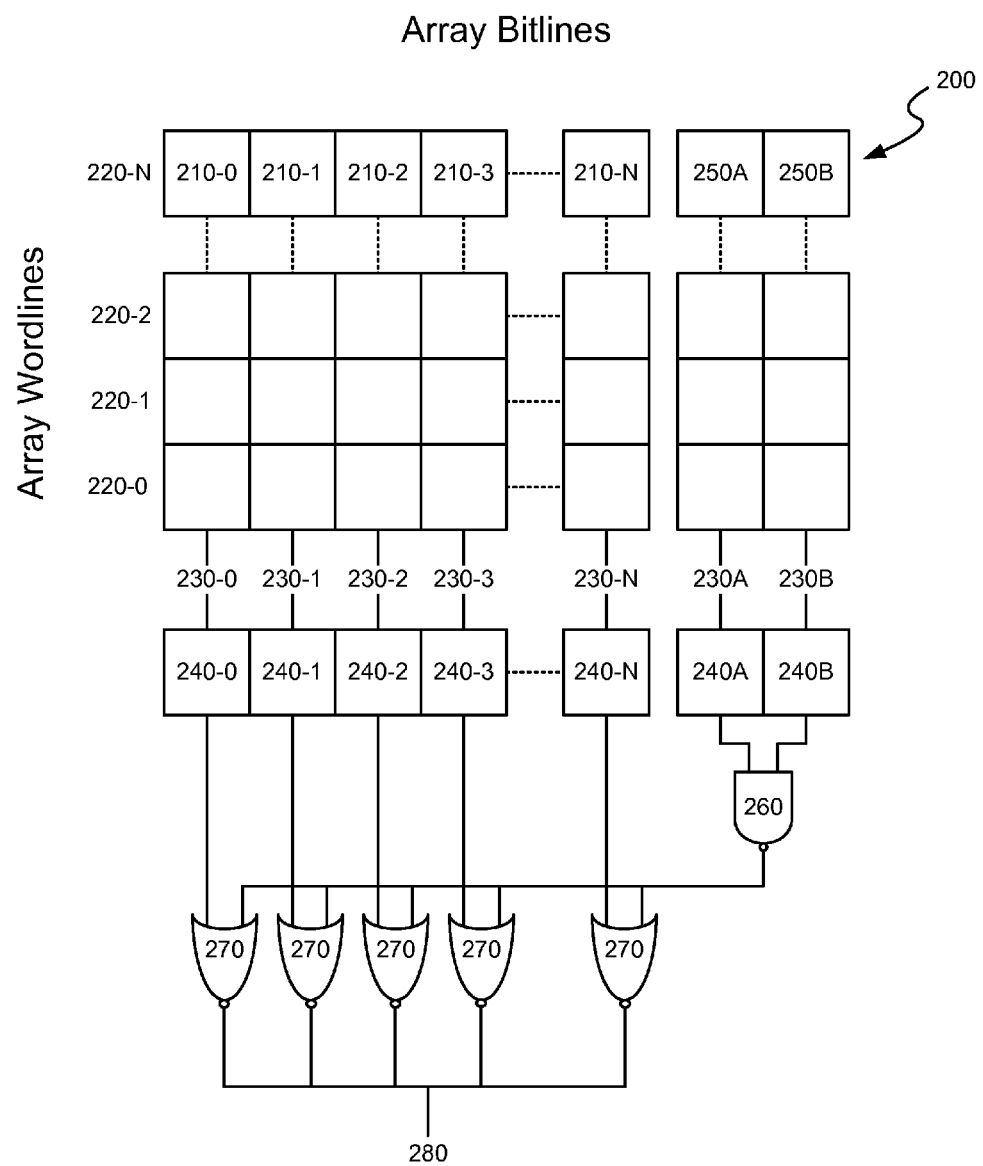
FIG. 2 depicts a diagram of an eFuse array with logic to detect if wordlines have been programmed, according to embodiments.

FIG. 2 depicts an array of eFuses using two FETs for memory cells, wherein selected cells indicate if wordlines have been programmed. The array of eFuses, along with accompanying logical gates, are hereinafter referred to as the eFuse array 200. The eFuse array 200 may be a component within a circuit. The eFuse array 200 includes an array of bitlines 230 and an array of wordlines 220. There may be many different amounts of wordlines 220 in an eFuse array. The eFuse array 200 depicts a first wordline 220-0, second wordline 220-1, third wordline 220-2, and an nth wordline 220-N, with a dotted line to signify the potential presence of a plurality of additional wordlines 220. Wordlines 220 may be equivalent to wordlines 105, 115, 125, of FIG. 1.

Rows of the eFuse array 200 may include a plurality of data cells. The terms data cells and memory cells may be used interchangeably herein as an element of a circuit which can hold a value of logical zero or logical one. Data cells may be coupled to the wordlines 220 and to the bitlines 230 of the eFuse array 200. In some embodiments, the number of bitlines 230 may be equivalent to the number of data cells which can hold a logical one or logical zero within the eFuse array 200. For example, there may be a bitline 230-0 for data cell 210-0, a bitline 230-1 for data cell 210-1, a bitline 230-2 for data cell 210-2, a bitline 230-3 for data cell 210-3, a bitline 230-N for data cell 210-N, a bitline 230A for indicator cell 250A, and a bitline 230B for indicator cell 250B. In certain embodiments, bitlines 230 may be coupled to sense amplifiers 240 to sense the values of data cells on respective wordlines 220. For example, bitline 230-0 may be coupled to sense amplifier 240-0, bitline 230-1 may be coupled to sense amplifier 240-1, bitline 230-2 may be coupled to sense amplifier 240-2, bitline 230-3 may be coupled to sense amplifier 240-3, bitline 230-N may be coupled to sense amplifier 240-N, bitline 230A may be coupled to sense amplifier 240A, and bitline 230B may be coupled to sense amplifier 240B.

Data cells may be eFuses of the eFuse array 200. The data cells may include a plurality of programmable data cells 210 which may be programmed to communicate instructions of the eFuse array 200 and a plurality of indicator data cells 250 which indicate if the programmable data cells 210 of the wordline 220 have been programmed. The plurality of cells 210 which can be programmed to communicate instructions may outnumber the plurality of indicator data cells 220. There may be any number of programmable data cells 210. For example, FIG. 2 depicts a wordline 220-N which includes a first programmable data cell 210-0, second programmable data cell 210-1, third programmable data cell 210-2, fourth programmable data cell 210-3, and nth programmable data cell 210-N, with a dotted line to signify the potential presence of a plurality of additional programmable data cells 210 coupled to the wordline 220-N. At the conclusion of the wordline 220-N, the plurality of indicator data cells 250 may be reserved to indicate whether or not the programmable data cells 210 of the wordline 220-N have been programmed.

After creation of the eFuse array 200, the eFuse array 200 may be tested. Upon creation, data cells of the eFuse array 200, whether programmable data cells 210 or indicator data cells 250, may have an equal chance of holding a logical zero or a logical one due to the nature of cells as two-FET memory cells as described herein. If there are two indicator data cells 250, there are four possible values of said indicator data cells: a one and a zero, a zero and a zero, a zero and a one, and a one and a one, respectively of the two indicator data cells 250. Given that, for any given indicator cell 250, the chances of being created with a logical zero or a logical one are equal, the chances of a given value combination (e.g., 1+0, 0+0, 0+1, 1+1) are equal. As such, with two indicator data cells 250A, 250B, the chances of any given combination may be 25%, whereas with three indicator data cells 250 the chances may be 12.5%, with four cells 250 it may be 6.25%, with five indicator data cells 250 the chances of any given combination may be 3.125%, and so on.

The eFuse array 200 may have logic which requires a specific value combination of indicator cell 250 values in order to pass the values of the programmable data cells 210. For example, the eFuse array 200 in FIG. 2 has logic which requires all indicator data cells 250 of a respective wordline 220 to have a value of one in order to allow values of the programmable data cells 210 within the respective wordline 220 to be passed to the primary output 280. In the embodiment in FIG. 2, this logic includes a nand gate 260 coupled to the sense amplifiers 240A, 240B for the indicator data cells 250. The logic in this example also includes a nor gate 270 functioning as a mask logic gate coupled to the bitlines 230-0, 230-1, 230-2, 230-3, 230-N for each programmable data cell 210. Each nor gate 270 may also be coupled to the nand gate 260. After the signal flows through this logic the data cells 210, 250 of the eFuse array 200 may be read, and unless all indicator data cells 250 read as a logical one, all data cells, whether programmable data cells or indicator data cells, may be forced to a logical zero as they are passed to the primary output 280.

In some embodiments, there may be more than two indicator data cells 250. Providing for more indicator data cells 250 may decrease the likelihood that the set of indicator data cells 250 are randomly created with a "passing" set of values (e.g., each indicator cell created with a logical value of one). For example, if there are five indicator data cells, there are 32 possible combinations of logical ones and logical zeros among the five indicator data cells, while only a single combination (e.g., every indicator cell holding a logical one value) may be allowed, meaning that, statistically speaking, 31 out of 32 created eFuse wordlines will be correctly identified as being in an initial state (e.g., having random values) and therein may be forced to a predetermined state (e.g., all zeros). Any number of indicator data cells 250 may be coupled to the nand gate 260 with the same logic as described above, which may therefore result in even better chances of an eFuse array 200 in initial state being correctly identified as such.

In some embodiments, all wordlines 220 may include the indicator data cells 250. In some such embodiments, an eFuse array 200 may be programmed in multiple distinct sessions. For example, in a first session, wordlines 220-N and 220-2 may be programmed, while wordlines 220-0 and 220-1 are left in an initial state and not programmed. In this example, the indicator data cells for wordlines 220-N and 220-2 may be changed to the selected logical state so that the downstream logic gates allow the values of the programmable data cells 210 in the programmed wordlines 220-N and 220-2 to flow to the output 280, while values of the non-programmed wordlines 220-0, 220-1 are overwritten (e.g., set to a default value of logical zero).

In certain embodiments, some wordlines 220 may not include the respective indicator data cells 250. For example, a subset of wordlines 220 may include "master sets" of indicator data cells 250 for the other wordlines of the eFuse array 200. In such an example, wordline 220-N may have a master set of indicator data cells 250 that are used to determine whether to pass or overwrite values for wordlines 220-2, 220-1, and 220-0. Alternatively, every other wordline 220 may include respective indicator data cells 250 for both itself and an adjacent wordline 220. By reducing the total amount of indicator data cells 250 within the eFuse array 200 the possibility of a false positive within an eFuse array 200 (e.g., a set of indicator data cells randomly being created in the selected logical state) may be reduced. In such embodiments, the eFuse array 200 may have alternate sense amplifier and/or logic configuration to avoid overwriting the bits of a wordline 220 without indicator data cells 250.

In certain embodiments, the eFuse array 200 may include alternate logic besides the nand gate 260 and nor gates 270 which may require a different set of bit values from the indicator data cells 250 in order for the values of the programmable cells 210 to pass to the primary output 280. Put differently, in some embodiments, rather than looking for all indicator data cells 250 to hold a logical one, the logic of the eFuse array 200 may look for all the indicator data cells to be a logical zero, or some particular order of logical ones and logical zeros. Such an embodiment may require different logic gates (e.g., and gates, or gates, xor gates, not gates, xnor gates) in an alternative configuration than is shown in FIG. 2.

Figure 3:
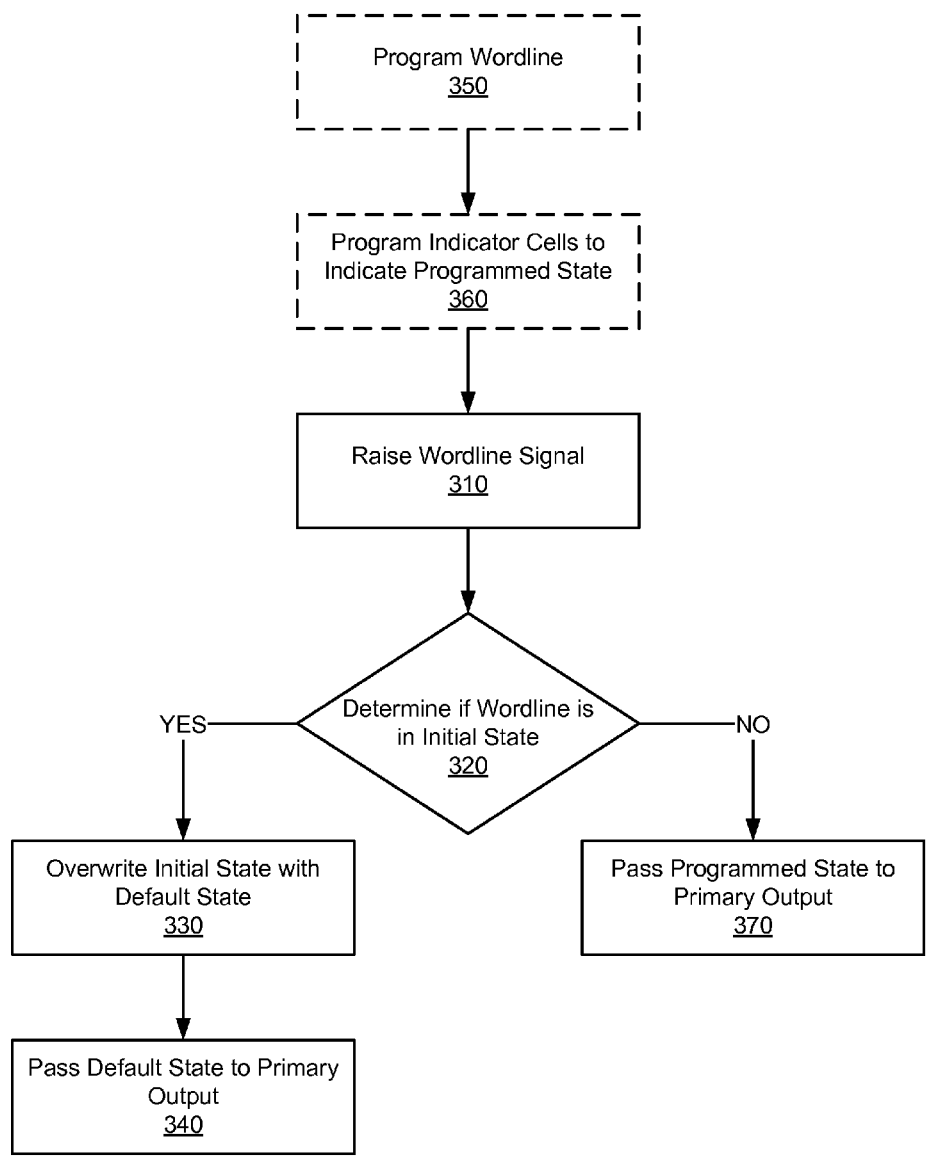
FIG. 3 depicts a method for detecting if wordlines have been programmed, according to embodiments.

FIG. 3 may depict one example of a method 300 of determining whether or not wordlines of an eFuse array using two FET memory cells are programmed. The method 300 of FIG. 3 may be completed on an eFuse array such as depicted in FIG. 2. Blocks with dotted edges within FIG. 3 may be optional steps. The visual arrangement of blocks in the flowchart of FIG. 3 is not to be construed as limiting the order in which the individual acts/operations may be performed, as certain embodiments may perform the operations of FIG. 3 in alternative orders.

The eFuse array may include indicator data cells in a wordline. The indicator data cells (e.g., indicator data cells 250 from FIG. 2) indicate whether or not the wordlines corresponding to the indicator data cells have been programmed. The eFuse array may be similar to the eFuse array 200 of FIG. 2. The wordline may include a plurality of wordlines (e.g., wordlines 220 from FIG. 2) and a plurality of bitlines (e.g., bitlines 230 from FIG. 2) which include a plurality of data cells.

The indicator data cells may be located at the end of the wordline as depicted herein, such that the rest of the wordline is comprised of programmable data cells (e.g., programmable data cells 210 from FIG. 2). Indicator data cells may have no structural difference from programmable data cells besides the logic coupled to the indicator data cells. By being located at the end of the wordline, the indicator data cells may be more varied due to variation in the sense amp, which may grant a higher likelihood of a correct determination of whether or not a wordline has been programmed. In other embodiments, the indicator data cells may be at other locations within the wordline. In some embodiments, each wordline of an eFuse array may include indicator data cells. In other embodiments, only particular wordlines of an eFuse array may include indicator data cells as described herein.

The wordline may be coupled to logic which overwrites an initial state of the eFuse array. An initial state may include random values (e.g., logical ones or logical zeros) of the programmable data cells as created rather than values which have been purposefully programmed to programmable data cells by an entity. When created, the initial state of an eFuse comprised of two FET memory cells may not be predictable. The logic of the eFuse array may overwrite the initial state when the indicator data cells are not in a selected logical state. For example, the selected logical state may be logical ones for each indicator data cell. In this example, the logic may include a single nand gate coupled to all indicator data cells of a wordline (e.g., a one-to-many relationship between one nand gate and many indicator data cells). The logic may also include a nor gate functioning as a mask logic gate for each programmable data cell of the wordline, where the nor gate is also coupled to the aforementioned nand gate (e.g., a series of one-to-one relationships between many individual programmable data cells and many individual nor gates). In this non-limiting example, the described logic may overwrite values in the programmable data cells by bringing to zero any values of the programmable data cells unless every indicator cell held a logical one. In some embodiments, other selected logical states may be possible through other logic gate combinations.

At block 310 the wordline signal is raised. The wordline signal may be raised for all wordlines of an eFuse array. Once the wordline signal is raised, at block 320 it is determined whether or not a wordline of the eFuse is in an initial state. The indicator data cells of a wordline may indicate the wordline being in an initial state by said indicator data cells holding values other than the selected logical state. For example, the eFuse array may include the selected logical state and logic gate configuration described above. If the eFuse array included two indicator data cells and the indicator data cells held values of 0 and 1, 0 and 0, or 1 and 0, it may be determined that the indicator data cells do not match the selected logical state of 1 and 1. Therefore, in this example, it may be determined that the wordline is in an initial state.

At block 320 it may be determined that the wordline is in an initial state. In response to this determination, at block 340 the initial state of the eFuse array may be overwritten. The logic of the initial state may overwrite (e.g., mask) all initial values of the wordline which was indicated to be in an initial state in block 320. The initial state may be overwritten through the logic of the eFuse array, such as the nand gate and nor gate as described above may overwrite the values of programmable data cells to a default state such as a set of logical zeros. The initial state may be overwritten to a known overwritten state (e.g., all zeros). This default state is then passed on to the primary output of the eFuse array at block 340. In some embodiments, downstream logic within the circuit and/or testing procedures may be created such that said downstream logic and/or testing procedures account for the known overwritten state. By being created to take into account the known overwritten state, testing procedures may be more likely to correctly determine how well circuits are designed/created.

At block 350 a wordline of the eFuse array may be programmed. The wordline may be programmed by changing the voltage of one of the two FETS of programmable data cells coupled to the wordline to signify a logical one or logical two as described herein. One or more wordlines of the eFuse array may be programmed. The programmable data cells may be programmed to execute operations of the eFuse array.

At block 360 the indicator data cells may be programmed to indicate that the wordlines are in a programmed state. The programmed state may indicate that the wordline which includes the indicator data cells includes programmable data cells which are no longer in the initial state. Instead, these programmable data cells may include the logical values of block 360. The indicator data cells may be programmed to indicate the programmed state by being programmed to the selected logical state. For example, using the logic described above, the indicator data cells may be changed to logical ones to indicate that the programmable data cells have been programmed.

In response to being programmed, at block 320 it may be determined that the wordline is not in the initial state. In response to this determination, at block 380 the programmed state of the wordline is passed to the primary output. The primary output may send the bit values of the programmable data cells to a circuit of the eFuse array. The logic of the eFuse array may allow the programmed state to pass through in response to the indicator data cells being in the selected logical state. In some embodiments, numerous wordlines which include indicator data cells which are in the selected logical state are passed to the primary output. In other embodiments, only a single wordline includes indicator data cells which are in the selected logical state, and therein only this single wordline is passed to the primary output.

Figure 4:
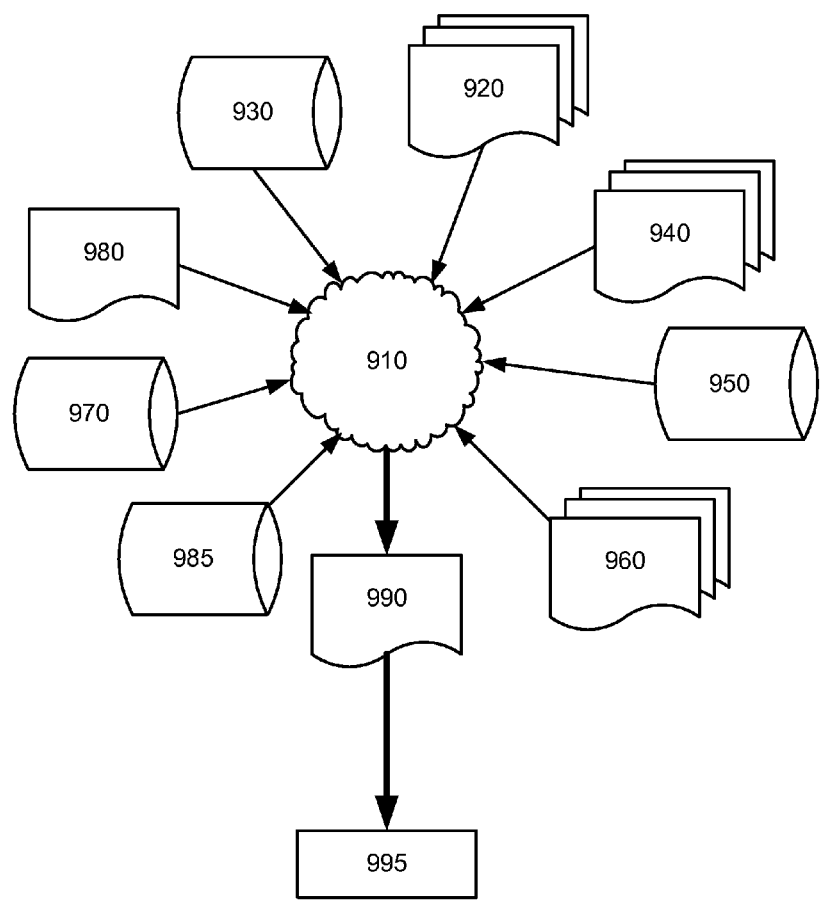
FIG. 4 depicts a flow diagram of a design process used in circuit design, manufacture, and/or test.

FIG. 4 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 2. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 2. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 2 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 2. In one embodiment, design structure 990 may comprise a compiled, executable HDL simulation model that functionally simulates the devices shown in FIG. 2.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 2. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. An array of eFuses that utilize two field effect transistors, the array of eFuses comprising:
    a plurality of rows of data cells, at least one row of the plurality of rows having a plurality of programmable data cells and a plurality of indicator data cells, wherein a selected logical state of the plurality of indicator data cells indicates that the plurality of data cells has been programmed;
    a wordline coupled to the plurality of programmable data cells and to the plurality of indicator data cells of the at least one row of data cells;
    a first plurality of bitlines coupled to the plurality of programmable data cells of the at least one row of data cells;
    a second plurality of bitlines coupled to the plurality of indicator data cells of the at least one row of data cells;
    a plurality of sense amplifiers coupled to the first and second plurality of bitlines, wherein each bitline of the first and second plurality of bitlines is coupled to a sense amplifier of the plurality of sense amplifiers;
    one or more logic gates coupled to outputs of the respective sense amplifiers coupled to the second plurality of bitlines, the one or more logic gates configured to determine if the plurality of indicator data cells are in the selected logical state; and
    a plurality of mask logic gates coupled to respective sense amplifiers coupled to the first plurality of bitlines and to one or more outputs of the one or more logic gates, the plurality of mask logic gates configured to mask outputs of the plurality of programmable data cells when the indicator data cells are not in the selected logical state.

2. The array of eFuses of claim 1, wherein the plurality of indicator data cells comprises at least five indicator data cells.

3. The array of eFuses of claim 1, wherein more than one row includes the plurality of programmable data cells and the plurality of indicator data cells.

4. The array of eFuses of claim 1, wherein:
    each row of the plurality of rows has a respective plurality of programmable data cells and a respective plurality of indicator data cells;
    the first plurality of bitlines is coupled to the respective plurality of programmable data cells of the plurality of rows;
    the second plurality of bitlines is coupled to the respective plurality of indicator data cells of the plurality of rows;
    the one or more logic gates coupled to outputs of the respective sense amplifiers coupled to the second plurality of bitlines, the one or more logic gates configured to determine if the respective plurality of indicator data cells are in the selected logical state; and
    the plurality of mask logic gates coupled to the respective sense amplifiers coupled to the first plurality of bitlines and to one or more outputs of the one or more logic gates, the plurality of mask logic gates to mask outputs of a distinct plurality of data cells when a respective distinct plurality of indicator data cells are not in the selected logical state.

5. The array of eFuses of claim 1, wherein the plurality of mask logic gates allow outputs of the plurality of programmable data cells through to a primary output when the indicator data cells are in the selected logical state.

6. The array of eFuses of claim 1, wherein eFuses of the array of eFuses comprise two field-effect transistors.

7. The array of eFuses of claim 1, wherein the plurality of indicator data cells of a respective row are located at a position within the eFuse array at which the plurality of indicator data cells will be read last.

8. The array of eFuses of claim 1, wherein:
    the one or more logic gates comprises a single nand gate; and
    the plurality of mask logic gates includes a plurality of nor gates.

9. The array of eFuses of claim 1, wherein the selected logic state is a logical one value for each indicator data cell of the plurality of indicator data cells.

10. A method for managing an array of eFuses which do not have a known logical state upon creation, the method comprising:
    determining whether a plurality of indicator data cells of a wordline of the array of eFuses are in a selected logical state;
    in response to determining that the plurality of indicator data cells are not in the selected logical state:
        determining that the plurality of data cells of the wordline is in an initial state in response to determining that the plurality of indicator data cells are not in the selected logical state, wherein the initial state includes unknown values;
        masking the initial state of the plurality of data cells with a default state;
        passing the default state to a primary output of the array of eFuses; and
    in response to determining that the plurality of indicator data cells are in the selected logical state, passing the programmed state to the primary output of the array of eFuses.

11. The method of claim 10, the method further comprising:
   programming the plurality of programmable data cells into a programmed state; and
   programming the plurality of indicator data cells into the selected logical state.

12. The method of claim 10, wherein the plurality of indicator data cells include at least five indicator data cells.

13. A non-transitory computer readable medium readable by a machine used in design, manufacture, or simulation of an integrated circuit with an array of eFuses with a plurality of rows and a plurality of columns, the design structure comprising:
   a plurality of rows of data cells, at least one row of the plurality of rows having a plurality of programmable data cells and a plurality of indicator data cells, wherein a selected logical state of the plurality of indicator data cells indicates that the plurality of data cells has been programmed;
   a wordline coupled to the plurality of programmable data cells and to the plurality of indicator data cells of the at least one row of data cells;
   a first plurality of bitlines coupled to the plurality of programmable data cells of the at least one row of data cells;
   a second plurality of bitlines coupled to the plurality of indicator data cells of the at least one row of data cells;
   a plurality of sense amplifiers coupled to the first and second plurality of bitlines, wherein each bitline of the first and second plurality of bitlines is coupled to a sense amplifier of the plurality of sense amplifiers;
   one or more logic gates coupled to outputs of the respective sense amplifiers coupled to the second plurality of bitlines, the one or more logic gates configured to determine if the plurality of indicator data cells are in the selected logical state; and
   a plurality of mask logic gates coupled to respective sense amplifiers coupled to the first plurality of bitlines and to one or more outputs of the one or more logic gates, the plurality of mask logic gates configured to mask outputs of the plurality of programmable data cells when the indicator data cells are not in the selected logical state.

14. The design structure of claim 13, wherein the plurality of indicator data cells comprises at least five indicator data cells.

15. The design structure of claim 13, wherein more than one row includes the plurality of programmable data cells and the plurality of indicator data cells.

16. The design structure of claim 13, the design structure further comprising:
   each row of the plurality of rows has a respective plurality of programmable data cells and a respective plurality of indicator data cells;
   the first plurality of bitlines is coupled to the respective plurality of programmable data cells of the plurality of rows;
   the second plurality of bitlines is coupled to the respective plurality of indicator data cells of the plurality of rows;
   the one or more logic gates coupled to outputs of the respective sense amplifiers coupled to the second plurality of bitlines, the one or more logic gates configured to determine if the respective plurality of indicator data cells are in the selected logical state; and
   the plurality of mask logic gates coupled to the respective sense amplifiers coupled to the first plurality of bitlines and to one or more outputs of the one or more logic gates, the plurality of mask logic gates to mask outputs of a distinct plurality of data cells when a respective distinct plurality of indicator data cells are not in the selected logical state.

17. The design structure of claim 13, wherein the plurality of mask logic gates allow outputs of the plurality of data cells through to a primary output when the indicator data cells are in the selected logical state.

18. The design structure of claim 13, wherein the design structure further comprises eFuses of the array of eFuses comprising two field-effect transistors.

19. The design structure of claim 13, wherein the plurality of indicator data cells of a respective row are located at a position within the eFuse array at which the plurality of indicator data cells will be read last.

20. The design structure of claim 13, the design structure further comprising:
   the one or more logic gates comprises a single nand gate; and
   the plurality of mask logic gates includes a plurality of nor gates.

* * * * *